United States Patent [19]
Yoo et al.

[11] Patent Number: 5,863,835
[45] Date of Patent: Jan. 26, 1999

[54] METHODS OF FORMING ELECTRICAL INTERCONNECTS ON SEMICONDUCTOR SUBSTRATES

[75] Inventors: Bong-Young Yoo, Seoul; Si-Young Choi, Kyungki, both of Rep. of Korea

[73] Assignee: Samsung Electronics Co., Ltd., Suwon, Rep. of Korea

[21] Appl. No.: 906,718

[22] Filed: Aug. 5, 1997

[30] Foreign Application Priority Data

Dec. 30, 1996 [KR] Rep. of Korea ................ 76995-1996

[51] Int. Cl.⁶ ................................................ H01L 21/28
[52] U.S. Cl. ..................... 438/666; 438/574; 438/579; 438/605; 438/652; 438/598; 257/4; 257/587
[58] Field of Search ................................ 438/182, 259, 438/270, 573, 574, 578, 579, 666, 672, 675, 625; 257/4, 587

[56] References Cited

U.S. PATENT DOCUMENTS

| | | |
|---|---|---|
| 5,032,541 | 7/1991 | Shinichi Sakamoto et al. ....... 437/203 |
| 5,288,654 | 2/1994 | Nobuynki Kasai et al. ............. 437/41 |
| 5,324,673 | 6/1994 | Jon T. Fitch et al. ..................... 437/40 |
| 5,451,551 | 9/1995 | Krishnan et al. ........................ 437/241 |
| 5,466,639 | 11/1995 | Ireland ..................................... 437/195 |
| 5,595,937 | 1/1997 | Mikagi ..................................... 437/192 |
| 5,602,423 | 2/1997 | Jain ......................................... 257/752 |
| 5,612,254 | 3/1997 | Mu et al. ................................. 437/195 |
| 5,614,765 | 3/1997 | Steven Avanzino et al. ........... 257/774 |
| 5,635,423 | 6/1997 | Huang et al. ............................ 437/195 |
| 5,651,855 | 7/1997 | Dennison et al. .................... 156/636.1 |
| 5,670,422 | 9/1997 | Suguru Tabara ........................ 437/192 |
| 5,686,354 | 11/1997 | Steven Avnazino et al. .......... 437/190 |
| 5,767,015 | 6/1998 | Suguru Tabara ........................ 438/654 |

*Primary Examiner*—Olik Chaudhuri
*Assistant Examiner*—Mike Dietrich
*Attorney, Agent, or Firm*—Myers Bigel Sibley & Sajovec

[57] ABSTRACT

Methods of forming electrical interconnects on semiconductor substrates include the steps of forming a first electrically insulating layer (e.g., silicon dioxide) and then forming a contact hole in the insulating layer to expose a layer underlying the insulating layer. A first electrically conductive region (e.g., W, Ti, Tin, Al) is then formed in the contact hole. A step is then performed to remove a portion of the first electrically insulating layer to define a recess therein which preferably surrounds an upper portion of the first conductive region. A second electrically conductive region (e.g., Al, Cu, W, Ti, Ta and Co) is then formed in the recess. Here, the first conductive region is preferably chosen to have good step coverage capability to fully bury the contact hole and the second conductive region is preferably chosen to have very low resistance even if some degree of step coverage capability is sacrificed. Planarization steps (e.g, CMP, etch-back) may also be performed to define the first conductive region in the contact hole and define the second conductive region in the recess surrounding the first conductive region. Barrier metal layers may also be conformable deposited in the contact hole prior to forming the first conductive region therein and in the recess prior to forming the second conductive region therein.

10 Claims, 4 Drawing Sheets

METHODS OF FORMING ELECTRICAL INTERCONNECTS ON SEMICONDUCTOR SUBSTRATES

FIELD OF THE INVENTION

The present invention relates to methods of forming semiconductor devices, and more particularly to methods of forming electrical interconnects on semiconductor substrates.

BACKGROUND OF THE INVENTION

According to the multilevel interconnect structure of a semiconductor device, the aspect ratio (the ratio of depth to width) of a contact or via hole generally continues to increase since a proportionate decrease in the contact or via hole depth is typically not realized with the decrease in the width of the contact or via hole. Accordingly, a conventional method for fabricating a metal interconnection layer has limitations, such as non-planarity, poor step-coverage, metal shorts, low yield and degraded reliability. To overcome these problems, a new interconnect technology called Dual Damascene process in which a contact plug and a metal interconnection layer are simultaneously formed, has been suggested.

FIGS. 1 through 4 are sectional views for explaining a method for forming a metal interconnection layer of a semiconductor device using a conventional Dual Damascene process.

Referring to FIG. 1, an insulating later 12 is formed on a semiconductor substrate 10. Subsequently, a lower metal layer 14 is formed on the insulating layer 12 and then a dielectric layer 16 is formed on the lower metal layer 14.

Referring to FIG. 2, the dielectric layer 16 is etched to form a contact hole 17 partially exposing the lower metal layer 14. Then, a barrier metal layer 18 is formed over the resultant structure. The barrier metal layer 18 may be formed of a titanium (Ti) film and a titanium nitride (tin) film.

Referring to FIG. 3, a metal layer 20 is formed of tungsten on the resultant structure having the barrier metal layer 18 formed therein by a chemical vapor deposition (CVD) method. Generally, the metal layer 20 formed by the CVD method must be formed of a material having a low resistance and excellent step coverage. If the metal layer 20 is not effectively buried in the contact hole 17, the contact resistance is increased.

Referring to FIG. 4, the metal layer 20 on the dielectric layer 16 is polished by a chemical mechanical polishing method to form a metal plug 22 buried in the contact hole 17 as a metal interconnection layer.

However, according to the method for forming the metal interconnection layer using the aforementioned conventional Dual Damascene process, since the metal layer 20 and a metal plug 22 are formed of the same material, the metal material for forming the metal layer 20 is restricted to a material having an excellent capability of burying the contact hole.

SUMMARY OF THE INVENTION

It is therefore an object of the present invention to provide improved methods of forming electrical interconnects on a substrate.

It is another object of the present invention to provide methods of forming reliable electrical interconnects having low resistance and good conformal coverage.

These and other objects, features and advantages are provided by methods of forming electrical interconnects containing at least first and second conductive materials which have low resistance and good conform ability (i.e., step coverage capability), respectively. In particular, these preferred methods include the steps of forming a first electrically insulating layer (e.g., silicon dioxide) and then forming a contact hole in the insulating layer to expose a layer underlying the insulating layer. A first electrically conductive region (e.g., W, Ti, Tin, Al) is then formed in the contact hole. A step is then performed to remove a portion of the first electrically insulating layer to define a recess therein which preferably surrounds an upper portion of the first conductive region. A second electrically conductive region (e.g., Al, Cu, W, Ti, Ta and Co) is then formed in the recess. Here, the first conductive region is preferably chosen to have good step coverage capability to fully bury the contact hole and the second conductive region is preferably chosen to have very low resistance even if some degree of step coverage capability is sacrificed. Planarization steps (e.g, CM2, etch-back) may also be performed to define the first conductive region in the contact hole and define the second conductive region in the recess surrounding the first conductive region. Barrier metal layers may also be conformable deposited in the contact hole prior to forming the first conductive region therein and in the recess prior to forming the second conductive region therein.

DESCRIPTION OF PREFERRED EMBODIMENTS

Figure 1:
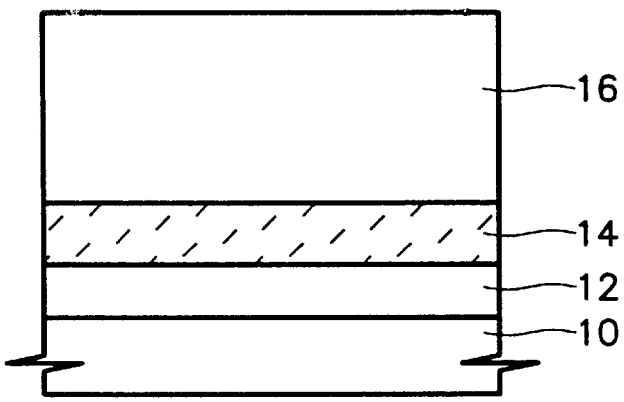
FIGS. 1–4 are cross-sectional views of intermediate structures which illustrate a method of forming an electrical interconnect according to the prior art.
Figure 2:
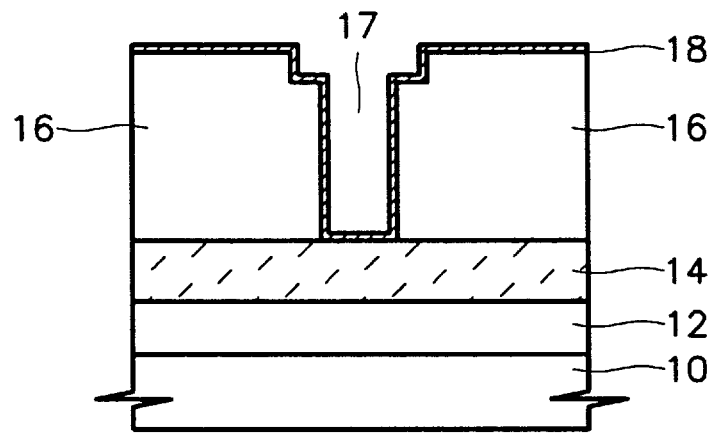
Figure 3:
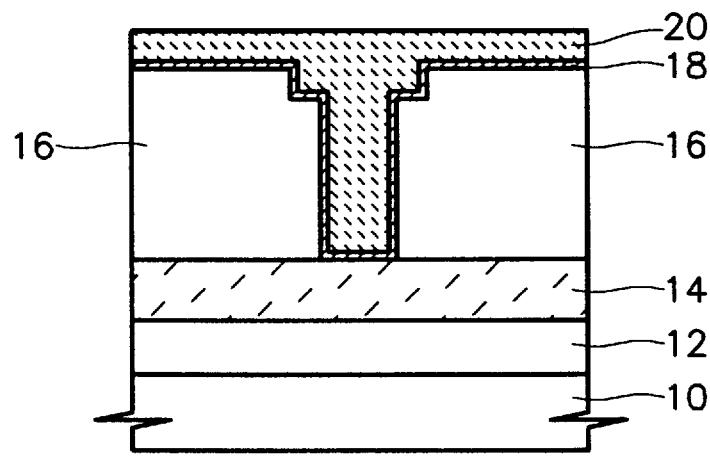
Figure 4:
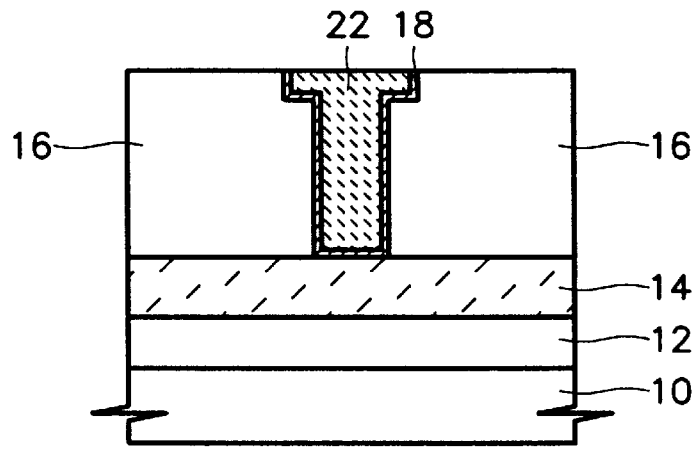

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Figure 5:
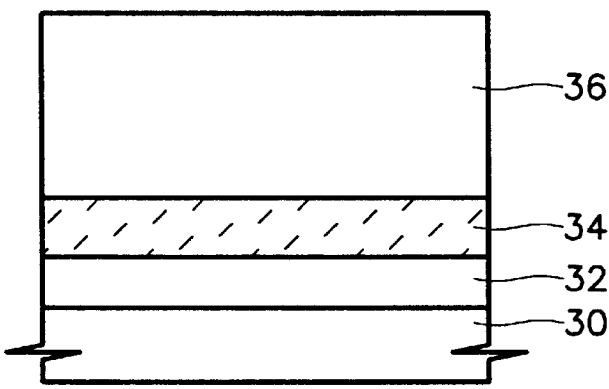
FIGS. 5–11 are cross-sectional views of intermediate structures which illustrate a method of forming an electrical interconnect according to a first embodiment of the present invention.

FIG. 5 shows a step of forming an insulating layer 32, a lower metal layer 34 and a dielectric layer 36. Referring to FIG. 5, the insulating layer 32 is formed over a semiconductor substrate 30 having a sub-structure (not shown) formed therein. Subsequently, the lower metal layer 34 is formed on the insulating layer 32 and then the dielectric layer 36 is formed on the lower metal layer 34. Although the lower metal layer 34 is formed in this embodiment, the lower metal layer 34 need not necessarily be formed in all cases.

Figure 6:
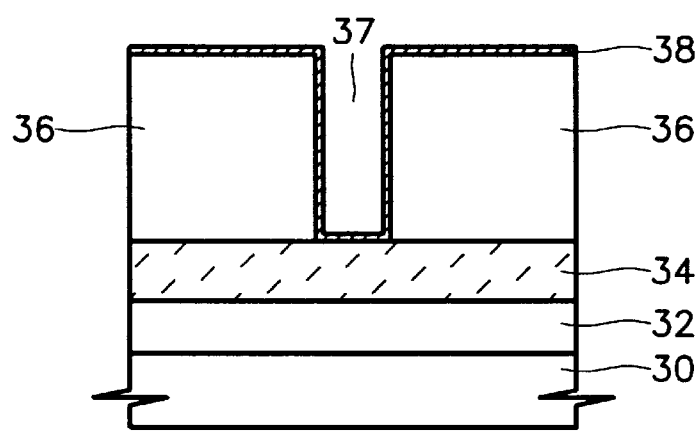

FIG. 6 shows a step of forming a contact hole 37 and a first barrier metal layer 38. Referring to FIG. 6, the dielectric layer 36 is etched to form the contact hole 37 exposing the lower metal layer 34. Subsequently, a first barrier metal layer 38 is formed over the entire surface of the resultant structure having the contact hole 37 formed therein.

Figure 7:
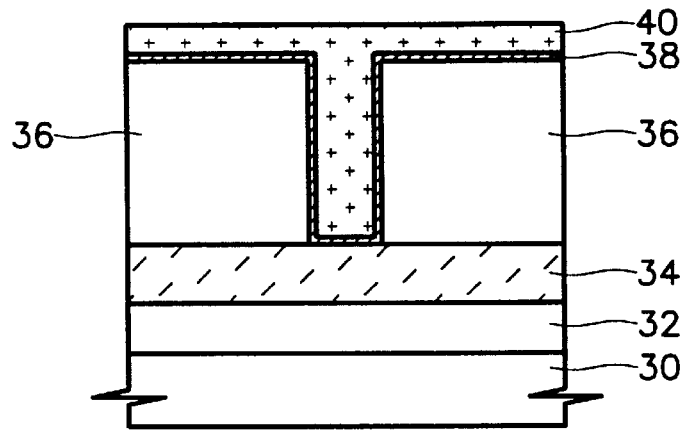

FIG. 7 shows a step of forming a first metal layer 40. Referring to FIG. 7, the first metal layer 40 for filling the contact hole 37 is formed. The first metal layer 40 may be formed of a material which completely fills the contact hole 37, for example, tungsten formed by the CVD method (CVD-W), titanium formed by the CVD method (CVD-Ti), titanium formed by the CVD method (CVD-Tin) or aluminum formed by the CVD method (CVD-Al).

Figure 8:
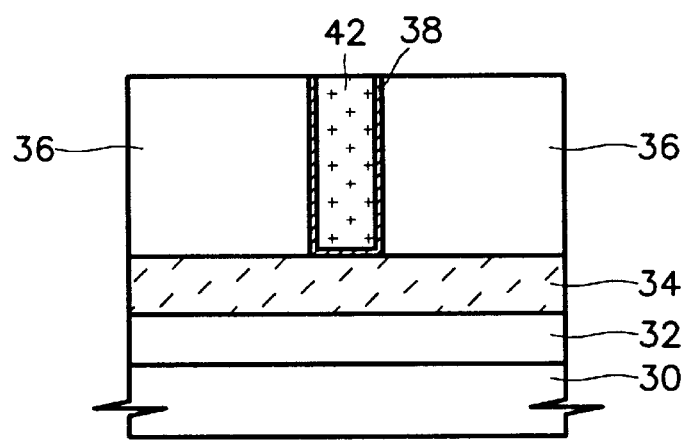

FIG. 8 shows a step of forming a metal plug 42. Referring to FIG. 8, the first metal layer 40 on the dielectric layer 35 is planarized by a chemical-mechanical polishing method or an etchback method to form the metal plug 42.

Figure 9:
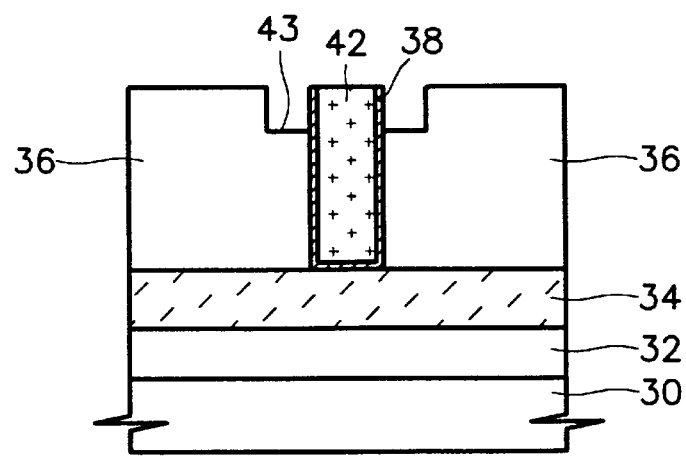

FIG. 9 shows a step of etching the face of the dielectric layer 36. Referring to FIG. 9, the face of the dielectric layer 36 is etched to form a recess region 43 partially exposing the first barrier metal layer 38 encompassing the metal plug 42. The first barrier metal layer 38 exposed by the recess region 43 may be etched, if necessary.

Figure 10:
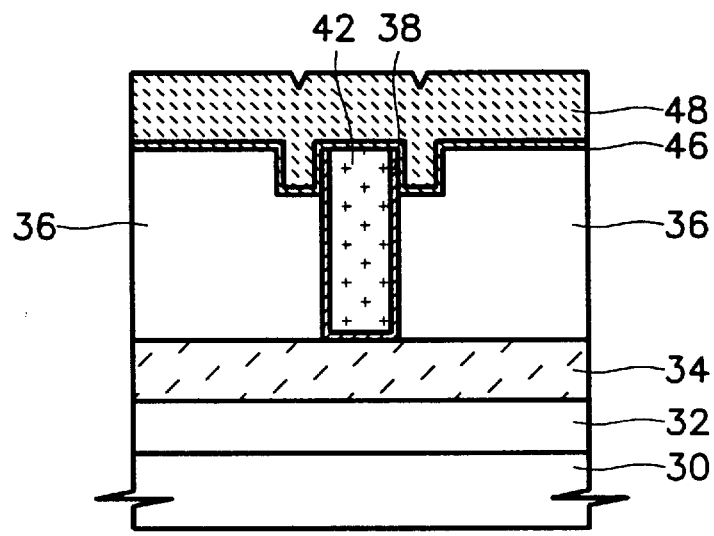

FIG. 10 shows a step of forming a second metal layer 48. Referring to FIG. 10, a second barrier metal layer 46 is formed over the entire surface of the resultant structure having the recess region 43 formed in the dielectric layer 36. Subsequently, the second metal layer 48 is formed over the entire surface of the substrate to fill the recess region 43. The second metal layer 48 may be formed of a material having a low resistance, e.g., Al, Cu, W, Ti, Ta or Co.

Figure 11:
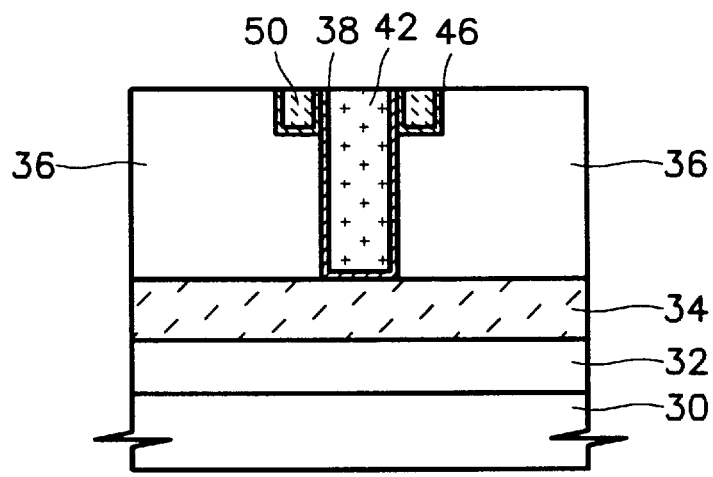

FIG. 11 shows a step of forming an upper metal layer 50. Referring to FIG. 11, the second metal layer 48 on the dielectric layer 36 is planarized by a chemical-mechanical polishing method or etchback method to form the upper metal layer 50 buried in the recess region 43.

As described above, according to the present invention, a metal plug is formed of a first metal layer having an excellent capability of burying the contact hole, and the metal plug is then connected with a second metal layer formed of a material having a low resistance, to complete a metal interconnection layer. Therefore, according to the present invention, the contact hole can be filled completely and the interconnection layer having a low resistance can be obtained.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming an electrical interconnect, comprising the steps of:

forming a first electrically insulating layer on a substrate;

forming a contact hole in the first electrically insulating layer;

forming a first electrically conductive region in the contact hole;

removing a portion of the first electrically insulating layer to define a recess therein which exposes a sidewall of the first electrically conductive region; and forming a second electrically conductive region in the recess.

2. The method of claim 1, wherein said step of forming a first electrically conductive region comprises forming a first electrically conductive region in the contact hole and on an upper surface of the first electrically insulating layer; and wherein said removing step is preceded by the step of planarizing the first electrically conductive region to expose the first electrically insulating layer.

3. The method of claim 2, wherein said removing step comprises etching the first electrically insulating layer to define a recess which surrounds the first electrically conductive region.

4. The method of claim 3, wherein said step of forming a first electrically conductive region in the contact hole is preceded by the step of conformable depositing a first barrier metal layer on the upper surface of the first electrically insulating layer and in the contact hole; and wherein said removing step comprises removing a portion of the first electrically insulating layer to define a recess therein which exposes the first barrier metal layer.

5. The method of claim 4, wherein said step of forming a second electrically conductive region in the recess is preceded by the step of conformable depositing a second barrier metal layer in the recess, in ohmic contact with the first barrier metal layer.

6. The method of claim 5, wherein said step of forming a second electrically conductive region in the recess is followed by the step of planarizing the second electrically conductive region and the second barrier metal layer to expose the first electrically conductive region.

7. The method of claim 6, wherein said step of forming a first electrically insulating layer on the face is preceded by the step of forming an underlying metal layer on the substrate; and wherein said step of forming a contact hole comprises forming a contact hole in the first electrically insulating layer to expose the underlying metal layer.

8. The method of claim 5, wherein said step of forming a first electrically conductive region comprises depositing a metal selected from the group consisting of tungsten, titanium, titanium nitride and aluminum and alloys thereof, in the contact hole.

9. The method of claim 8, wherein said step of forming a second electrically conductive region comprises forming a second electrically conductive region comprising a material selected from the group consisting of aluminum, copper, tungsten, titanium, tantalum and cobalt and alloys thereof, in the recess.

10. The method of claim 6, wherein said step of planarizing the second electrically conductive region comprises chemically-mechanically polishing or etching the second electrically conductive region and the second barrier metal layer to expose the first electrically conductive region.

* * * * *